United States Patent
Chuang et al.

[11] Patent Number: 6,153,517
[45] Date of Patent: Nov. 28, 2000

[54] LOW RESISTANCE POLY LANDING PAD

[75] Inventors: Kun-Jung Chuang, Peng-Hu; Shou-Yi Hsu, Hsin-Chu; Yi-Te Chen, Hsin-Chu; Hon-Hung Lui, Hsin-Chu, all of Taiwan

[73] Assignee: Taiwan Semiconductor Manufacturing Company, Hsin-Chu, Taiwan

[21] Appl. No.: 09/266,880

[22] Filed: Mar. 12, 1999

[51] Int. Cl.[7] .................................................. H01L 21/44
[52] U.S. Cl. .......................................... 438/657; 438/239
[58] Field of Search .................................... 438/239, 637, 438/638, 639, 640, 641, 651, 655, 254, 238, 586, 592, 663, 657; 437/192; 257/377

[56] References Cited

U.S. PATENT DOCUMENTS

| | | | |
|---|---|---|---|
| 5,036,378 | 7/1991 | Lu et al. | 357/23.5 |
| 5,198,683 | 3/1993 | Sivan | 257/67 |
| 5,262,352 | 11/1993 | Woo et al. | 437/189 |
| 5,298,792 | 3/1994 | Manning | 257/758 |
| 5,477,074 | 12/1995 | Yen | 257/377 |
| 5,633,196 | 5/1997 | Zamanian | 438/653 |
| 5,719,071 | 2/1998 | Miller et al. | 437/192 |
| 5,895,239 | 4/1999 | Jeng et al. | 438/239 |
| 6,001,771 | 12/1999 | Lien | 438/586 |
| 6,020,255 | 2/2000 | Tsai et al. | 438/618 |

OTHER PUBLICATIONS

Chang et al., "ULSI Technology", The McGraw–Hill Companies Inc., NY (1996), pp. 255, 376, 377.
Wolf, "Silicon Processing for the VLSI Era", vol. 2: Process Integration, Lattice Press, Sunset Beach, CA(1990), p. 376.

*Primary Examiner*—David Nelms
*Assistant Examiner*—David Nhu
*Attorney, Agent, or Firm*—George O. Saile; Stephen B. Ackerman

[57] ABSTRACT

A method is disclosed for forming a low resistance poly landing pad which is achieved by shunting the polysilicon of a landing pad with metallic conductors. A window is opened through a first dielectric layer to expose a conducting region over a semiconductor substrate. A metallic layer, deposited overall, is followed by an overall deposition of a polysilicon layer, with the layers being sufficient to fill the window completely. Metal and polysilicon outside the window is removed by chemical/mechanical polishing which also provides global planarization. Salicidation provides a silicide cover over the exposed surface of polysilicon, which was formed by the polishing. A second dielectric is deposited and an opening is formed to the landing pad. Electrical contact is made between metallization on the second dielectric layer and the salicide of the landing pad either, directly by simultaneous deposition of the metallization on the dielectric and the landing pad, or, by first forming a plug in the opening and then depositing the metallization.

25 Claims, 4 Drawing Sheets

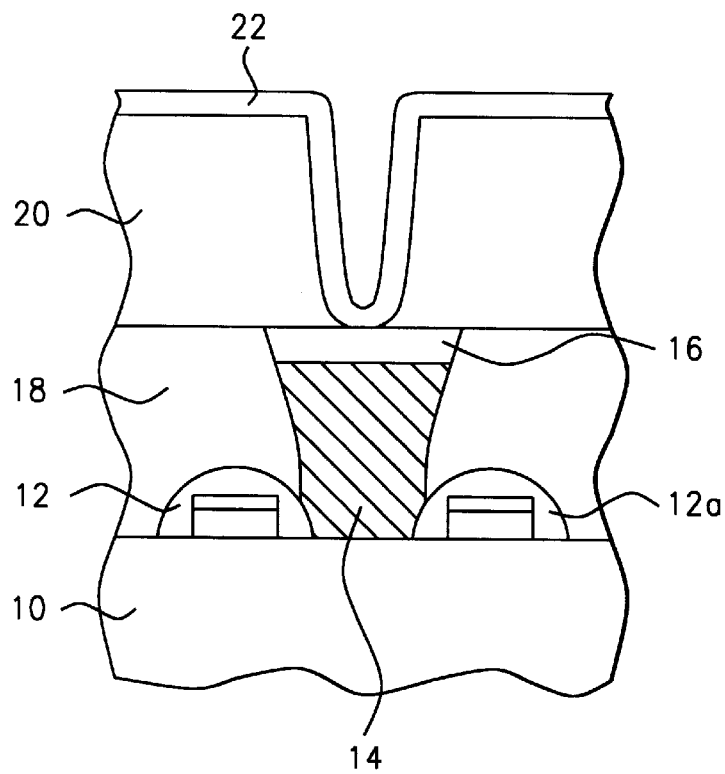
FIG. 1A – Prior Art
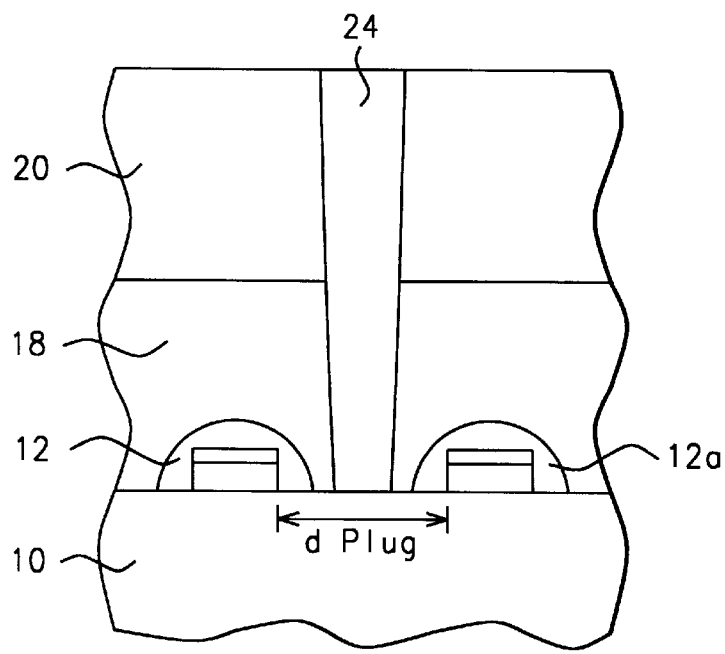
FIG. 1B – Prior Art

LOW RESISTANCE POLY LANDING PAD

BACKGROUND OF THE INVENTION (1) Field of the Invention

The present invention relates to the fabrication of semiconductor integrated circuits, and more particularly to methods of forming improved interconnections and landing pad structures in semiconductor integrated circuits.

(2) Desciption of Prior Art

Polysilicon, or poly, landing pads are used, in ultra large-scale integration technology, as interconnections between upper level conducting media and the substrate. An important feature of landing pads, as they are conventionally fabricated, is that they conserve area and thus provide for smaller device geometries. This results because poly landing pads are self-aligned contacts. Making high-reliability electrical contact between metallization layers and semiconductor regions is a problem often encountered in integrated circuit processing. In particular, contacts between aluminum and diffused regions of silicon substrates pose extreme reliability risks because of the affinity of aluminum and silicon toward interdiffusion when in contact. A barrier layer can readily be incorporated in a poly landing pad to alleviate the aluminum-silicon interdiffusion problems.

Several methods have been disclosed for forming poly landing pads with a barrier which also facilitate small cell area. In U.S. Pat. No. 5,633,196 to Zamanian, the landing pad preferably comprises a silicide layer disposed over a barrier layer which is disposed over a polysilicon layer. The barrier layer could be a refractory metal, and the order, silicide over barrier, is not essential; barrier over silicide is also preferred. U.S. Pat. No. 5,719,071 to Miller et. al. provides a method of forming a poly landing pad which comprises a tungsten layer disposed over a polysilicon layer and has the additional property of being a good etch stop. A common feature of conventional methods of fabricating poly landing pads is that the different layers are in series, so that diffusing species cannot circumvent the barrier layer.

Poly landing pads are widely used in integrated circuit devices. U.S. Pat. No. 5,036,378 to Lu et. al. discloses a memory device that incorporates a poly landing pad to facilitate small cell size. Interlevel electrical connections are provided by poly landing pads in a memory device disclosed in U.S. Pat. No. 5,198,683 to Sivan. U.S. Pat. No. 5,298,792 to Manning shows a method of forming bi-level poly landing pads. A method of constructing an integrated circuit utilizing poly landing pads is described in U.S. Pat. No. 5,477,074.

A common problem of conventional poly landing pads is that they often exhibit high electrical resistance. Resistances higher than 10,000 ohms have been measured. High resistance limits the design tolerance on circuit speed, gives rise to excessive power consumption and causes circuits to be outside of wafer acceptance test specifications. Thus high resistance curtails the usefulness of poly landing pads.

A conventional poly landing pad in a typical application is shown in FIG. 1A Prior Art. Referring to the figure, an opening is formed in a first interlevel dielectric layer 18 exposing a doped region of a silicon substrate 10. This doped region electrically connects transistors 12 and 12a as well as acting as the source of one and the drain of the other. A poly landing pad comprises at least a polysilicon layer 14 deposited in the opening in contact with the doped region. Layer 16 represents other layers of the poly landing pad, which could comprise a barrier layer disposed over a polysilicon layer; or a composite layer disposed over a polysilicon layer, with the constituent layers of the composite layer disposed over each other; or layer 16 may not be there. In the application shown in FIG. 1A Prior Art, contact is made to the upper surface of the poly landing pad, through an opening formed in a second interlevel dielectric layer 20, by conductors 22 situated over second dielectric layer 20.

The channel resistance is about 1000 ohms per micron channel length as given in C. Y. Chang and S. M. Sze, ULSI Technology, McGraw-Hill, New York, 1996, page 376. With feature sizes below 0.3 microns, channel resistances are about 300 ohms or less. It is thus important that the resistance associated with the poly landing pad be substantially less than 300 ohms for feature sizes 0.3 microns and below, if performance is not to be impaired.

The specific contact resistance of a metal to highly doped silicon may reach about 10 E-7 ohms-cm2 as a lower limit, in practice etch residues and damage may cause values 10 to 100 times larger to be observed; Chang and Sze, op. cit. pages 376–377. Metal to metal specific contact resistance is less than about 10 E-8 ohms-cm2; Chang and Sze, op. cit. page 376. Wolf; in Silicon Processing For The ULSI Era, vol. 2, Lattice Press, Sunset Press, Sunset Beach, Calif., page 253; provides data which implies a polysilicon to crystalline silicon specific contact resistance of about 6×10 E-7 ohms-cm2. Chang and Sze; op. cit. page 255; indicate that polysilicon resistivities are usually greater than 4×10 E-3 ohm-cm. Metal resistivities are typically less than 10 E-5 ohm-cm.

Using the above values of resistivity and specific contact resistance, estimates of poly landing pad resistance are readily made once its geometry is specified. For 0.3 micron feature size, the shape can be taken to be a figure of revolution with a radius of 0.3 micron at the upper surface tapering down to a radius of 0.15 microns at the lower surface. The height of the poly landing pad can be taken to be 1.0 micron and barrier or other metal layers can be taken to be 0.1 micron.

The layers of a conventional poly landing pad are in series, so the resistance of the pad is the sum of the bulk and contact resistances of the layers. When a poly landing pad, with no metal layers and with pad dimensions and properties as cited above, connects a diffused region of the substrate to an upper polysilicon layer, its resistance will be about 1132 ohms ; unless contract resistances are increased by contamination or damage, in which case much higher values can be observed. In the same situation, except that a metal layer is disposed over the polysilicon in the pad, the resistance, in absence of contamination, is increased to about 1191 ohms. If the connection is to an upper metallic conductor, the resistance of the poly landing pad with no metallic layers is about 1165 ohms and with a metallic layer the resistance is about 1159 ohms. Contamination could result in much larger pad resistances, and, in fact, resistances are observed in the range of 10 E 4 ohms. Even the lowest values to be expected of a conventional poly landing pad is in excess of 1000 ohms, which is more than three times the channel resistance, 300 ohms; certainly large enough to lead to significant reductions in performance.

Another interconnection method that is relevant to the present invention is the plug, represented in FIG. 1B Prior Art. As depicted, the plug conductor connects a diffused substrate region with conductors disposed above tie second dielectric layer. A reliable connection cannot be accomplished by depositing the upper level conductor directly into the contact opening at the same time it is deposited over the second dielectric layer because the step coverage would be too low. However, at small feature sizes, such as 0.3 microns and below, the aspect ratio is about six or higher and at such high aspect ratios even the plug reliability cannot be guaranteed. An additional disadvantage of a conventional plug is shown in FIG. 1B Prior Art; the spacing between transistors, denoted dplug, is required to be larger for a conventional plug interconnection than the corresponding spacing when a poly landing pad is used. This is because poly landing pads are self-aligned contacts.

SUMMARY OF THE INVENTION

Accordingly, it is a primary objective of the invention to provide a method for fabricating a low resistance poly landing pad. It is also a primary objective of the invention to provide a method for fabricating a combination interconnection, comprised of a plug disposed on a low resistance poly landing pad. In addition to the advantages of a low resistance poly landing pad, this combination interconnection has the advantage of a low aspect ratio for the plug.

In accordance with the objectives of the invention a low resistance poly landing pad is achieved by shunting the polysilicon of the landing pad with metallic conductors. A window is opened through a first dielectric layer to expose a conducting region over a semiconductor substrate. A metallic layer, deposited overall, is followed by an overall deposition of a polysilicon layer, with the layers being sufficient to fill the window completely. Metal and polysilicon outside the window is removed by chemical/mechanical polishing which also provides global planarization. Salicidation provides a silicide cover over the exposed surface of polysilicon, which was formed by the polishing. A second dielectric is deposited and an opening is formed to the landing pad. Electrical contact is made between metallization on the second dielectric layer and the salicide of the landing pad either, directly by simultaneous deposition of the metallization on the dielectric and the landing pad, or, by first forming a plug in the opening and then depositing the metallization.

BRIEF DESCRIPTION OF THE DRAWINGS

In the accompanying drawings, forming a material part of this description, there is shown:

FIG. 1A Prior Art shows a conventional poly landing pad used to connect metallization over a second dielectric layer to a doped region of the substrate.

FIG. 1B Prior Art depicts a conventional plug used to connect metallization over a second dielectric layer to a doped region of the substrate.

DESCRIPTION OF THE PREFERRED EMBODIMENTS

Figure 2A:
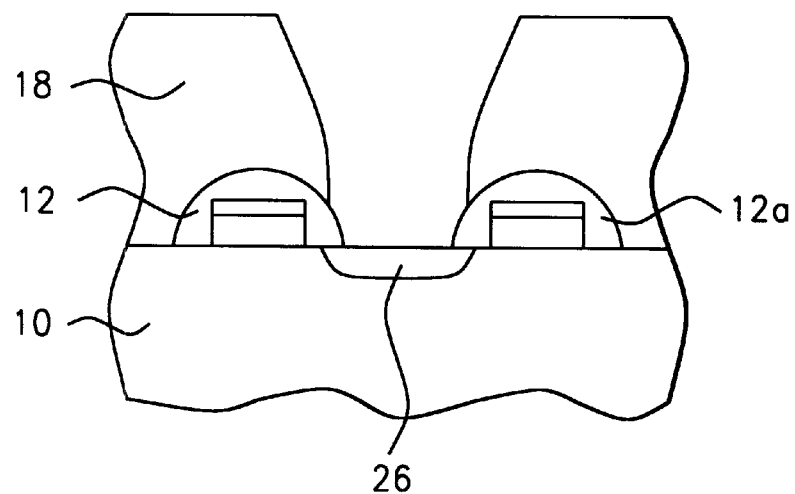
FIGS. 2A–2D present the process flow and structure of a novel low resistance poly landing pad.

Referring to FIG. 2A there is shown a portion of a partially processed semiconductor wafer. The window to the conducting region 26, through a first level dielectric layer 18, is the first step in the novel low resistance poly landing pad process flow. As is the case with conventional poly landing pads, a low resistance poly landing pad is a self aligned contact; the etching materials used to open the window are chosen not to etch the insulators surrounding the gates, therefor the window mask can be substantially larger than the contact area. The window mask can even overlap the gate, which allows for gates to be more closely spaced, resulting in significant savings of area. In a most preferred embodiment of the invention the region 26 would be salicide, however it could be other conducting material, such as part of a doped source and/or drain region.

Figure 2B:
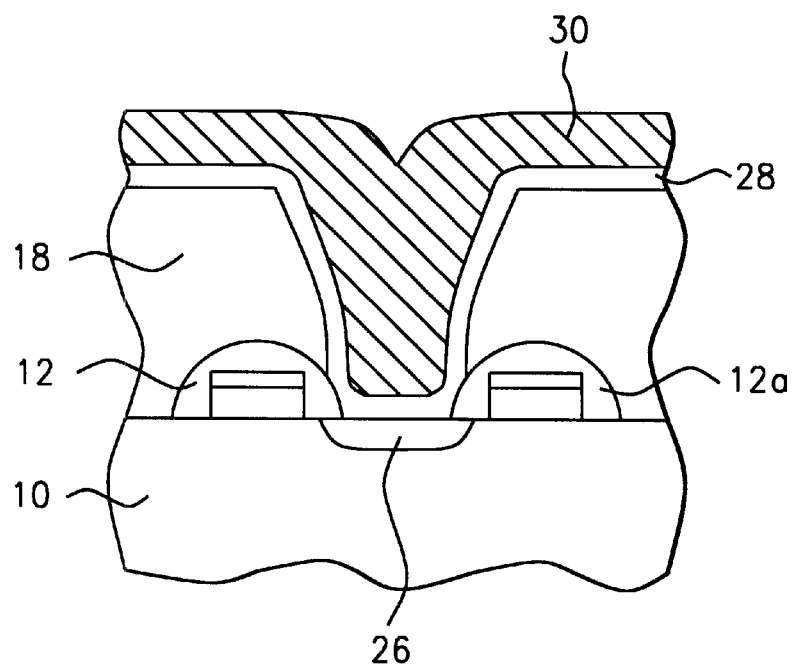

Next the open window is partially filled with conducting material in a manner such that a low resistance metallic path shunts the higher resistance polysilicon, which will fill the remainder, and also to provide for a markedly reduced contact resistance. Accordingly, a metallic layer, 28 in FIG. 2B, is deposited to cover the sidewalls and bottom of the landing pad, providing a reduction in both its bulk and contact resistance. When this layer is composed of a refractory metal, it also serves as a diffusion barrier blocking the penetration of Si, Al and other atoms whose unrestricted passage would cause yield and reliability problems. A thickness of between 0.05 and 0.1 micron provides an adequate barrier layer and a significant reduction in resistance, although, in an embodiment of this invention, this layer could entirely fill the landing pad. Any metal can be used that has low resistivity, is a good diffusion barrier for silicon and metallization atoms, and can be deposited reliably to properly cover the step of the window. Titanium, cobalt, tungsten, their suicides or a layer of silicide over a layer of metal are examples of appropriate metallic layers. Procedures for depositing these and other appropriate metals are well known to those versed in the art.

A polysilicon layer, 30, is then deposited overall, achieving the structure shown in FIG. 2b; with the metal and polysilicon layers more than filling the poly landing pad window and extending over the wafer. Procedures for depositing polysilicon layers are well known to those versed in the art.

Layers 28 and 30 outside of the poly landing pad are extraneous and need to be removed. Enough material needs to be removed so that outside the poly landing pad only the first level dielectric material exists on the surface. Chemical and mechanical polishing (CMP) is well known to those versed in the art and is the optimum procedure to accomplish this removal. CMP is preferred because it has the advantages that no masking steps are required and that a globally planarized surface is achieved.

Figure 2C:
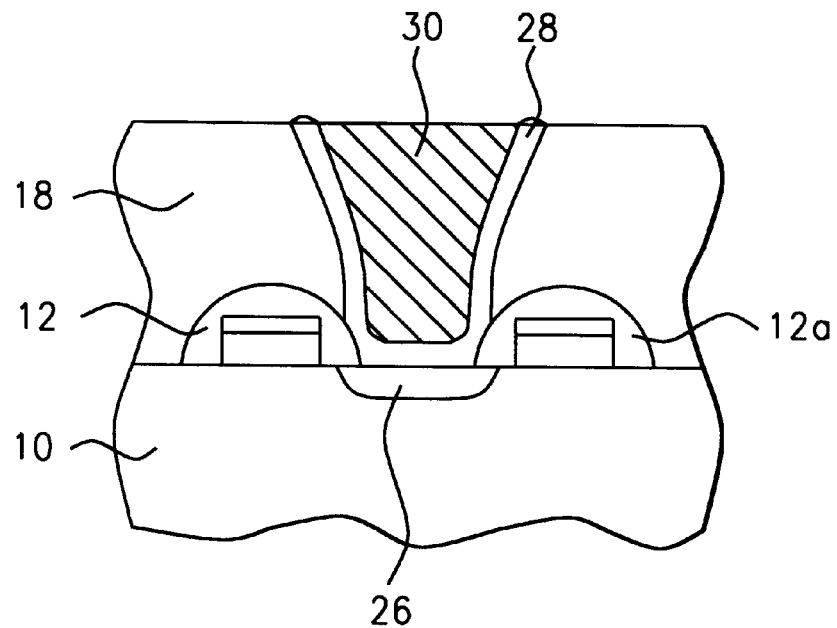
Figure 2D:
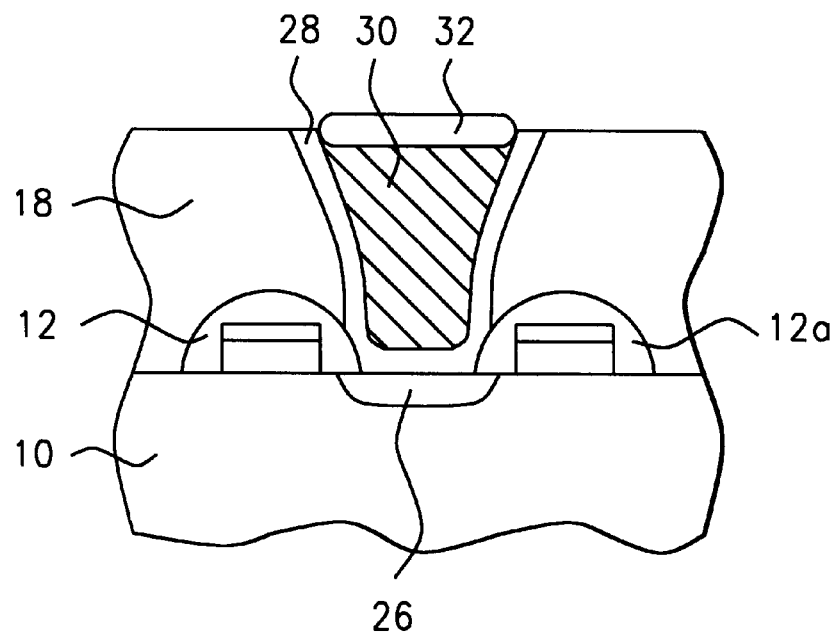

After CMP the structure is as depicted in FIG. 2C, with the polysilicon of the landing pad surrounded by metallic layers except at the top. The last step in forming the low resistance poly landing pad is to completely surround the polysilicon by forming a metallic layer over the polysilicon. Preferably this layer should be salicide, since then no masking steps are required. As is well known to those versed in the art salicide is formed by an overall deposition of either Ti or Co, followed by heating steps to form $TiSi_2$ or $CoSi_2$ where the metal is in contact with silicon. The unreacted metal is rinsed off in a chemical wash leaving only the silicide layer 32, as shone in FIG. 2D which depicts a low resistance poly landing pad.

Resistances of low resistance poly landing pads can be estimated using resistivity and specific contact resistance values given above in the "Description of Prior Art" section. As above with conventional poly landing pads, the height of the low resistance poly landing pad is taken to be 1 micron, with an upper radius of 0.3 micron tapering to a 0.15 radius at the bottom. The thickness of layers 28 and 32 are taken to be 0.05 micron. When such a landing pad connects a salicide region, which is disposed over a diffused region of a silicon substrate, to an upper metallic layer, the resistance introduced is about 34 ohms and for a polysilicon upper layer this resistance is about 66 ohms. When the same connections are accomplished by a conventional poly landing pad of similar dimensions, the resistances are greater than 450 ohms. When the lower is connection is directly to a diffused region, not via salicide, the resistance introduced by the low resistance poly landing pad is about 157 ohms if the upper connection is to a metallic layer, and about 189 ohms if to a polysilicon layer. The corresponding resistances when the conventional poly landing pad is used are in excess of 1000 ohms. The channel resistance is about 300 ohms for a channel length of 0.3 microns, as cited above. Conventional poly landing pads with geometries appropriate for 0.3 feature size are not usable since they introduce resistances well in excess of the channel resistance, Low resistance poly landing pads of appropriate geometries provide substantial improvement, with those connecting to salicide Over diffused regions providing the lowest resistance.

Figure 3A:
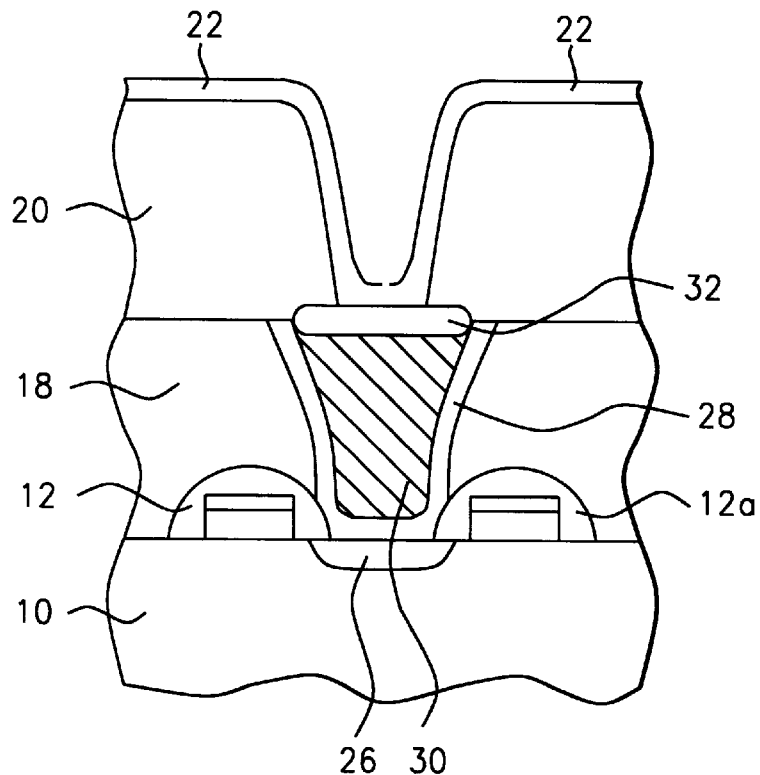
FIG. 3A shows a low resistance poly landing pad used to connect metallization over a second dielectric layer to a conducting region of the substrate.

Connection of conductive layers, such as metal or polysilicon lines, disposed over the second level dielectric to a low resistance poly landing pad can be made as depicted in FIG. 3A, in the same manner as with a conventional poly landing pad shown in FIG. 1A Prior Art. Layer 22 could be a metal or high conductivity polysilicon and is simultaneously deposited over second level dielectric 20, the step and the salicide layer 32 of the landing pad. It is apparent that contact to a low resistance poly landing pad is to a metallic layer and connecting metallic layers provide low resistance paths for current flow through the landing pad. This accounts for its low resistance.

Figure 3B:
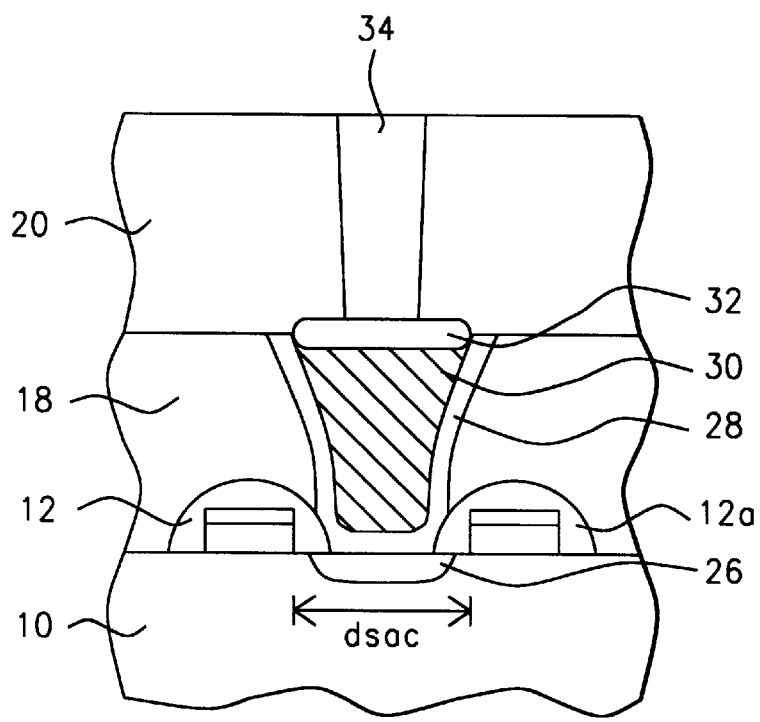
FIG. 3B depicts a novel low resistance poly landing pad—plug combination interconnection.

A disadvantage of a direct contact, such as depicted in FIG. 3A, is that even with the landing pad the aspect ratio could still be large enough so that a sufficiently reliable covering of the sidewall cannot be assured. To alleviate this problem it is preferable to utilize a combination interconnection, which is a part of this disclosure. This interconnection is shown in FIG. 3B. It is composed of a metal plug, layer 34, disposed over a novel low resistance poly landing pad and is constructed in the following manner. After the salicide is formed over the polysilicon of the landing pad, the second level dielectric is deposited. An opening is etched through the second level dielectric, over the landing pad, stopping at the salicide layer. The opening is then filled with metal; tungsten or aluminum, for example; using techniques described in the book by Chang and Sze, previously cited, on pages 407 to 412.

There are several advantages to the combination interconnection over a metal plug that extends through both level of dielectric. One advantage is that the plug aspect ratio is smaller by about one half in the combination interconnection, as is clearly by comparing FIGS. 1B and 3B. Another advantage is that the transistor spacing can be maintained at that appropriate for a landing pad, dsac in FIG. 3B, which, being a self aligned contact, is considerably smaller than for a plug, dplug in FIG. 1B, through both levels of dielectric. This is because moderate misalignment of the plug in the combination interconnection does not present a problem. The upper surface of the low resistance landing pad being larger than the lower surface presents a larger target for the plug of the combination interconnection and there are no structures present on the first level dielectric surface that the plug could land on.

While the invention has been particularly shown and described with reference to the preferred embodiments thereof, it will be understood by those skilled in the art that various changes in form and detail may be made without departing from the spirit and scope of the invention.

What is claimed is:

1. A method of forming a low resistance poly landing pad comprising the following steps:

provided a partially processed semiconductor wafer containing transistors with conducting regions extending to the semiconductor substrate surface and gate structures having sidewall spacers and top insulating layers disposed under a first dielectric layer;

opening a window through said first dielectric layer to at least one of said conducting regions using an etching scheme with high selectivity of the first dielectric layer material to silicon, the conducting region material, and the material of said sidewall spacers and top insulating layers;

depositing a blanket metallic layer followed by a blanket layer of polysilicon, which together more than fill said window;

performing chemical and mechanical polishing to remove said metallic layer and polysilicon layer except within said window;

forming salicide over the exposed polysilicon.

2. The method of claim 1 wherein said dielectric layer is silicon oxide.

3. The method of claim 1 wherein said dielectric layer is silicon nitride.

4. The method of claim 1 wherein said dielectric layer is silicon oxynitride.

5. The method of claim 1 wherein said metallic layer is composed of a refractory metal.

6. The method of claim 1 wherein said metallic layer is composed of titanium.

7. The method of claim 1 wherein said metallic layer is composed of cobalt.

8. The method of claim 1 wherein said metallic layer is composed of tungsten.

9. The method of claim 1 wherein said metallic layer is composed of two parallel metallic layers, at least one of which is a good barrier against interdiffusion of silicon and metallurgy atoms.

10. The method of claim 1 wherein said metallic layer is composed of a titanium layer disposed under a layer of TiSi2.

11. The method of claim 1 wherein said metallic layer is composed of a cobalt layer disposed under a layer of CoSi2.

12. The method of claim 1 wherein the silicide of said salicide is TiSi2.

13. The method of claim 1 wherein the silicide of said salicide is CoSi2.

14. A method of forming a low resistance poly landing pad comprising the following steps:

providing a partially processed semiconductor wafer containing transistors with conducting regions extending to the semiconductor substrate surface and gate structures having sidewall spacers and top insulating layers disposed under a first dielectric layer;

opening a window through said first dielectric layer to at least one of said conducting regions using an etching scheme with high selectivity of the first dielectric layer material to silicon, the conducting region material, and the material of said sidewall spacers and top insulating layers;

depositing a blanket metallic layer followed by a blanket layer of polysilicon, which together more than fill said window;

performing chemical and mechanical polishing to remove said metallic layer and polysilicon layer except within said window;

forming salicide over the exposed polysilicon;

depositing a blanket second dielectric layer;

opening a window through said second dielectric layer to the low resistance landing pad;

patterning and depositing a metallization layer over said second dielectric layer, the step of the window of said dielectric layer and said salicide layer.

15. The method of claim 14 wherein said dielectric layer is silicon oxide.

16. The method of claim 14 wherein said dielectric layer is silicon nitride.

17. The method of claim 14 wherein said dielectric layer is silicon oxynitride.

18. The method of claim 14 wherein said metallization layer is composed of a materials from the set; Al, Al—Cu, Cu, W, poly—Si, Ti, Wsi2, TiSi2.

19. A method of forming a low resistance poly landing pad comprising the following steps:

providing a partially processed semiconductor wafer containing transistors with conducting regions extending to the semiconductor substrate surface and gate structures having sidewall spacers and top insulating layers disposed under a first dielectric layer;

opening a window through said first dielectric layer to at least one of said conducting regions using an etching scheme with high selectivity of the first dielectric layer material to silicon, the conducting region material, and the material of said sidewall spacers and top insulating layers;

depositing a blanket metallic layer followed by a blanket layer of polysilicon, which together more than fill said window;

performing chemical and mechanical polishing to remove said metallic layer and polysilicon layer except within said window;

forming salicide over the exposed polysilicon;

depositing a blanket second dielectric layer;

opening a window through said second dielectric layer to the low resistance landing pad;

forming a metal plug within said window through said dielectric layer;

patterning and depositing a metallization layer over said second dielectric layer and over said metal plug.

20. The method of claim 19 wherein said dielectric layer is silicon oxide.

21. The method of claim 19 wherein said dielectric layer is silicon nitride.

22. The method of claim 19 wherein said dielectric layer is silicon oxynitride.

23. The method of claim 19 wherein the metal of said metal plug is W.

24. The method of claim 19 wherein the metal of said metal plug is Al.

25. The method of claim 19 wherein said metallization layer is composed of a materials from the set; Al, Al—Cu, Cu, W, poly—Si, Ti, Wsi2, TiSi2.

* * * * *